(12) United States Patent
Liu

(10) Patent No.: US 6,169,440 B1
(45) Date of Patent: Jan. 2, 2001

(54) OFFSET-COMPENSATED SWITCHED-OPAMP INTEGRATOR AND FILTER

(75) Inventor: Shen-Iuan Liu, Keelung (TW)

(73) Assignee: National Science Council (TW)

( * ) Notice: Under 35 U.S.C. 154(b), the term of this patent shall be extended for 0 days.

(21) Appl. No.: 09/342,278

(22) Filed: Jun. 29, 1999

(30) Foreign Application Priority Data

Mar. 10, 1999 (TW) ................................ 88103696

(51) Int. Cl.[7] .............................. H03K 5/00; G06F 7/64
(52) U.S. Cl. ...................... 327/337; 327/336; 327/554; 327/558
(58) Field of Search ................. 327/554, 336, 327/337, 341, 344, 94, 558

(56) References Cited

U.S. PATENT DOCUMENTS

| | | | |
|---|---|---|---|
| 4,365,204 | 12/1982 | Haque | 328/127 |
| 4,393,351 | 7/1983 | Gregorian et al. | 328/127 |
| 4,999,634 | 3/1991 | Brazdrum et al. | 341/172 |
| 5,168,461 | * 12/1992 | Wu et al. | 364/828 |
| 5,477,481 | 12/1995 | Kerth | 364/825 |
| 5,724,000 | 3/1998 | Quinn | 327/554 |
| 6,023,191 | * 2/2000 | Connell et al. | 327/554 |

OTHER PUBLICATIONS

Steyaert et al. "Switched–capacitor filters driven with very low voltage clock signals" Electronics Letters, Nov. 25, 1993 vol. 29 No. 24.
Basenirotto et al. A 1V 1.8MHz CMOS Switched–Opamp SC Filter with Rail–to_Rail output Swing, Electronic letters, Mar. 3, 1994, vol. 30, No. 5.
Crols et al. Switched–Opamp: An Approach to Realize Full CMOS Switched–Capacitor Circuits at Very Low Power Supply Voltages, IEEE Journal of Solid–State Circuits, vol. 29, No. 8, Aug., 1994.
Baschirotto et al. A 1–V 1.8–MHz CMOS Switched–Opamp SC Filter with Rail–to–Rail output Swing, IEEE Journal of Solid State Circuits, vol. 32, No. 12, Dec. 1997.

* cited by examiner

Primary Examiner—Dinh T. Le
(74) Attorney, Agent, or Firm—Fish & Richardson P.C.

(57) ABSTRACT

An integrator and a filter having offset compensated switched-opamp are implemented in the present invention. In the present invention, offset voltages caused by amplifiers used in a integrator or a filter can be compensated and such circuits can be operated under a low power voltage.

4 Claims, 5 Drawing Sheets

OFFSET-COMPENSATED SWITCHED-OPAMP INTEGRATOR AND FILTER

BACKGROUND OF THE INVENTION

1. Field of the Invention

The present invention generally relates to an integrator and filter constituted of one or more offset-compensated switched-capacitor circuits. More specifically, it relates to an integrator and filter capable of working under a low operation voltage.

2. Description of Related Art

To achieve faster operation, integrated circuits require an increase in integration, thereby increasing power consumption. Hence, a low operation voltage is desired for various integrated circuits and systems processing analog or digital signals. Many technicians try to improve fabrication arts, circuit and logic design, structure, or algorithms to meet the requirements of low operation voltage to drive communication, electronic, and computer products. One of the most direct improvements is to modify the circuit design to operate the integrated circuit under a low supply voltage and then reduce the power consumption. In the such circuit design, many MOS transistors within integrators and filters are used to implement the integrated circuit. But the threshold voltage of MOS transistors (about 0.7 to 1 voltage) actually limits their practical utility.

Conventional switched-capacitor circuits are mainly applied to implement the analog and digital signal process circuits, including analog-to-digital converters, digital-to-analog converters, and sampling-hold circuits. However, the offset voltages of amplifiers in the integrators and filters effect the operation precision. Solutions for the above problem include (1)MOS switches with low threshold voltages disclosed in "A 1.4V switched capacitor filter", in IEEE Proceeding of CICC, pp. 8.2.1–8.3.4, May 1900, by K. Takasuka, etc., (2)a method to raise the clock boosting disclosed in "1.2V CMOS switched-capacitor circuits", in IEEE Int. Solid-State Circuit Conference, pp. 388–389, February 1996, by J. T. Wu., etc., and (3)a switched-opamp technique disclosed in "Switched-opamp: an approach to realize full CMOS switched-capacitor circuit at very low power supply voltage", IEEE J. Solid-State Circuit, SC-29, pp. 936–942, August 1994 by J. Crols, etc. A specific fabricating process is necessary to realize method (1), so the cost is higher than common methods. While the mentioned specific fabricating process is not needed in method (2), the trend of semiconductor devices is to low operation voltage. And while it is not necessary to execute the specific fabricating process or raise the clock boosting in method (3), the offset voltage problem from MOS transistors still exists.

SUMMARY OF THE INVENTION

It is therefore an object of the present invention to provide an offset-compensated switched-capacitor integrator and filter, which can be operated under a low supply voltage and compensate the offset voltage of the opamp with switched-capacitor circuits, thereby improving the operation precision.

The present invention provides one integrator having offset-compensated switched-capacitor circuits, which can be operated under a low power voltage, comprising a first amplifier having a non-inverting input terminal coupled to a ground, an inverting input terminal, and an output terminal; a first capacitor, which has a terminal receiving said input signal and another terminal coupled to said inverting input terminal of said first amplifier; a first switch coupled between said first capacitor and said ground; a second switch and a third switch coupled to said inverting input terminal of said first amplifier, wherein said third switch is also coupled to said output terminal of said first amplifier; a second capacitor, which has a terminal coupled to said second switch and another terminal coupled to said output terminal of said first amplifier; a third capacitor coupled to said output terminal of said first amplifier; a second amplifier comprising a non-inverting input terminal coupled to said ground, an inverting input terminal coupled to said three capacitors, and an output terminal; and a fourth capacitor and a fourth switch coupled in parallel between said inverting input terminal and said output terminal of said second amplifier; wherein a first timing waveform operates said first switch and second switch and a second timing waveform operates said third switch and fourth switch, said first and second timing waveforms having a same period and showing different logic levels at the same time.

The present invention provides another integrator having offset-compensated switched-capacitor circuits, which is able to be operated under a low power voltage, comprising a first amplifier having a non-inverting input terminal coupled to a ground, an inverting input terminal, and an output terminal; a fifth capacitor coupled to said inverting input terminal of said first amplifier; a first capacitor, which has a first terminal coupled to said fifth capacitor and a second terminal receiving an input signal; a first switch coupled between said second terminal of said first capacitor and said ground; a second switch coupled between said ground and a terminal coupling said first capacitor and said fifth capacitor; a third switch coupled to said terminal coupling and said first capacitor said fifth capacitor; a second capacitor coupled between said third switch and said output terminal of said first amplifier; a fourth switch coupled between said inverting input terminal and said output terminal of said first amplifier; a third capacitor coupled to said output terminal of said first amplifier; a second amplifier comprising a non-inverting input terminal coupled to said ground, an inverting input terminal coupled to said three capacitors, and an output terminal; and a fourth capacitor and a fifth switch coupled in parallel between said inverting input terminal and said output terminal of said second amplifier; wherein a first timing waveform operates said first, second and fourth switches and a second timing waveform operates said third switch and fifth switch, said first and second timing waveforms having a same period and showing different logic levels at the same time.

The present invention provides one filter having offset-compensated switched-capacitor circuits, which can be operated under a low supply voltage, comprising a first amplifier having a non-inverting input terminal coupled to a ground, an inverting input terminal, and an output terminal; a first capacitor coupled to said inverting input terminal of said first amplifier; a first switch coupled between said first capacitor and a signal input terminal; a second switch coupled between said ground and a terminal coupling said first capacitor and said first switch; a second capacitor coupled to said output terminal of said first amplifier; a third switch coupled between said inverting input terminal of said first amplifier and said second capacitor; a fourth switch coupled between said output terminal and said inverting input terminal of said first amplifier; a third capacitor coupled to said output terminal of said first amplifier; a second amplifier having a non-inverting input terminal coupled to a ground, an inverting input terminal coupled to said third capacitor, and an output terminal; a fourth capacitor and a fifth switch coupled in parallel between said inverting input terminal and said output terminal of said second amplifier; a fifth capacitor coupled to said output terminal of said second amplifier; a seventh switch coupled to said fifth capacitor; a sixth switch coupled between said inverting terminal of said second amplifier and a terminal coupling said fifth capacitor and said seventh switch; a ninth capacitor coupled to said seventh switch; an eighth switch coupled between said ground and a terminal coupling said seventh switch and said ninth capacitor; a third amplifier having a non-inverting input terminal coupled to a ground, an inverting input terminal coupled to said ninth capacitor, and an output terminal; a ninth switch coupled between said inverting input terminal and said output terminal of said third amplifier; a tenth switch and an eleventh switch coupled in parallel to a terminal coupling said ninth capacitor and said seventh switch; a six capacitor coupled between said tenth switch and said output terminal of said third amplifier; a seventh capacitor coupled between said eleventh switch and said output terminal of said third amplifier; a twelfth switch coupled between said inverting input terminal of said third amplifier and a terminal coupling said eleventh switch and said seventh capacitor; an eighth capacitor coupled to said output terminal of said third amplifier; a thirteenth switch coupled between said eighth capacitor and said ground; and a fourteenth switch coupled to said inverting input terminal of said first amplifier and a terminal coupling said eighth capacitor and said thirteenth switch; wherein a first timing waveform operates said second, third, fifth, sixth, eighth, ninth, eleventh, twelfth, and fourteenth switches and a second timing waveform operates said first, fourth, seventh, tenth, and thirteenth switch, said first and second timing waveforms having a same period and showing different logic levels at the same time.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 2:
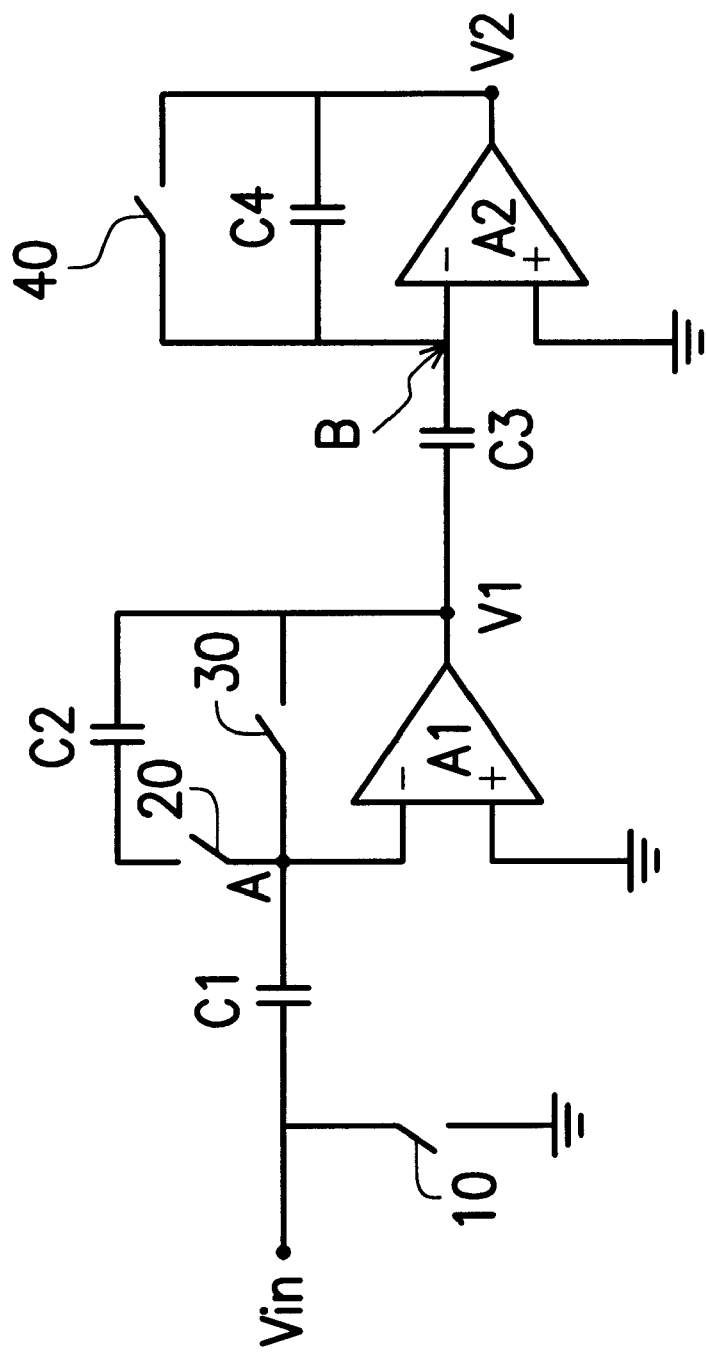
FIG. 2 is a circuit diagram illustrating a non-inverting integrator of a preferred embodiment of the present invention.

Referring to FIG. 2, a preferred embodiment in accordance with the present invention is shown as a non-inverting integrator circuit, including two amplifiers A1 and A2 coupled in series, four capacitors C1, C2, C3, and C4, and four MOS switches 10, 20, 30, and 40.

Figure 3:
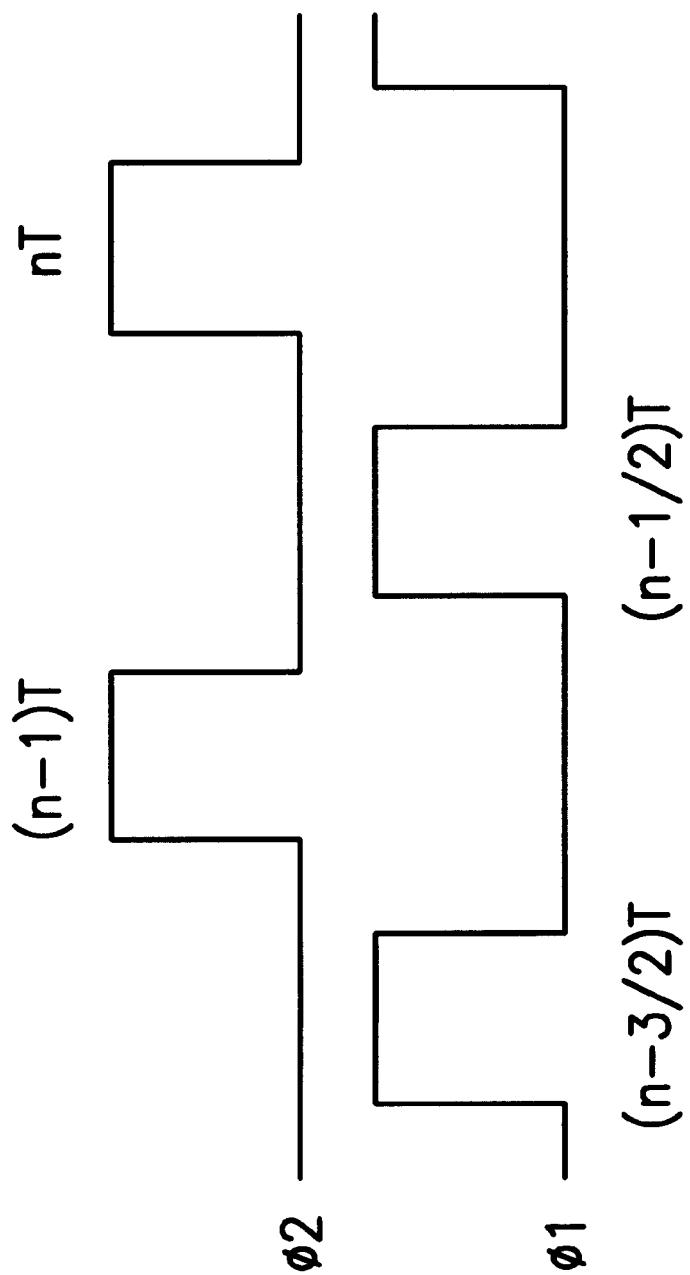
FIG. 3 is a timing diagram applied in all embodiments of this application.

FIG. 3 is a timing diagram illustrating two timing waveforms 01 and 02 related to the FIG. 2, wherein the switches 10, 20, and 40 are in response to the timing waveform 01 and the switch 30 is in respond to the timing wave form 02. Note that timing waveforms 01 and 02 having the same period show different logic levels at the same time, that is, switches 10, 20, and 40 are on/off while switch 30 is off/on while the non-inverting integrator is operated.

When 01 rises to a high logic level, the input capacitor C1 whose initial voltage is Vin(nT–T/2)–Voff1 is discharged to –Voff1, where the voltage Vin is an input voltage and the voltage Voff1 is an offset voltage of the amplifier A1. On the other hand, the capacitor C2 whose initial voltage is V1(nT–3T/2)–Voff1 is charged to V1(nT–T/2)–Voff1. Thus, the charge conservation at node A gives:

$$C1[-Voff1-Vin(nT-T/2)+Voff1]+C2[V1(nT)-Voff1-(V1(nT-T)-Voff1)]=0 \quad (1)$$

Therefore, $$V1(nT-T/2)-V1(nT-3T/2)=(C1/C2)Vin(nT-T) \quad (2)$$

It is obvious that the offset voltage Voff1 in the non-inverting integrator circuit of this preferred embodiment is compensated based on the present invention.

Furthermore, when 01 rises to a high logic level, the capacitor C3 whose initial voltage is V1(nT–T/2)–Voff2 is discharged to Voff1–Voff2, where the voltage Voff2 is an offset voltage of the amplifier A2. On the other hand, the capacitor C4 is charged from zero voltage to V2(nT)–Voff2. Similarly, the charge conservation at node B gives:

$$C3[Voff1-Voff2-V1(nT-T/2)+voff2]+C4[V2(nT)-Voff2]=0 \quad (3)$$

If the capacitance of the capacitor C3 is equal or similar to the capacitance of the capacitor C4, equation (3) can be simplified to $$V2(nT)=V1(nT-T/2)+Voff2-Voff1 \quad (4)$$

And if the offset voltage Voff1 of the amplifier A1 is close to the voltage Voff2 of the amplifier A2, the purpose of offset compensation can be also achieved. In addition, because all MOS switches are coupled to a ground terminal or a virtual ground terminal of the amplifiers, the non-inverting integrator circuit can be operated under a low supply voltage.

Figure 4:
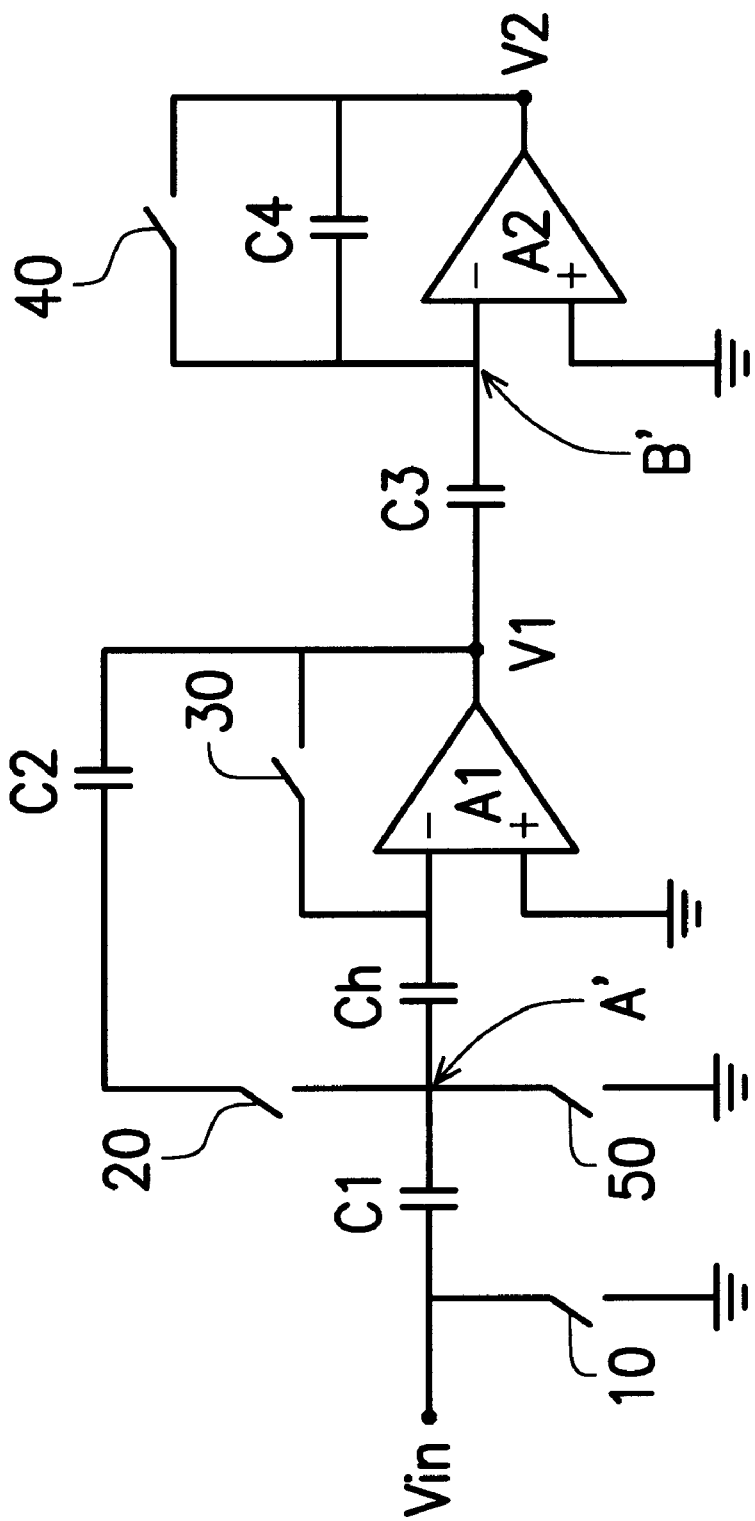
FIG. 4 is a circuit diagram illustrating an inverting integrator of another preferred embodiment of the present invention.

FIG. 4 is a circuit diagram illustrating an inverting integrator of another preferred embodiment of the present invention. As shown in the figure, the inverting integrator comprises two amplifiers A1 and A2 coupled in series, four capacitors C1, C2, C3, and C4, and four MOS switches 10, 20, 30, and 40 which have same symbols and function as in FIG. 2. In addition, there is a capacitor Ch to store the offset voltage Voff1 of the amplifier A1 and a switch 50 in the inverting integrator.

Similar to the non-inverting integrator shown in FIG. 2, the timing diagram having two timing waveforms 01 and 02 shown in FIG. 3 is applied to the inverting integrator shown in FIG. 4, wherein the switches 10, 30, and 50 are in response to the timing waveform 01 and the switches 20 and 40 are in response to the timing waveform 02. Note that timing waveforms 01 and 02 having the same period show different logic levels at the same time, that is, switches 10, 30, and 50 are on/off while switch 20 and 40 are off/on while the inverting integrator is operated.

By similar analysis as made in the non-inverting integrator, when 02 rises to a high logic level in the inverting integrator in FIG. 3, the charge conservation at node A' gives:

$$C1Vin(nT)+C2[v1(nT)-V1(nT-T)]=0 \quad (5)$$

Therefore, $$V1(nT)-V1(nT-T)=-(C1/C2)Vin(nT) \quad (6)$$

On the other hand, when 01 rises to a high logic level and the capacitance of the capacitor C3 is equal to the capacitance of the capacitor C4, the charge conservation at node B' gives:

$$V2(nT-T/2)=V1(nT-T)+Voff2-Voff1 \quad (7)$$

If the two offset voltages Voff1 and Voff2 of the relative amplifiers A1 and A2 are close, the purpose of offset compensation can be also achieved. In addition, because all MOS switches are coupled to a ground terminal or a virtual ground terminal of the amplifiers, the inverting integrator circuit can be operated under a low supply voltage.

Figure 5:
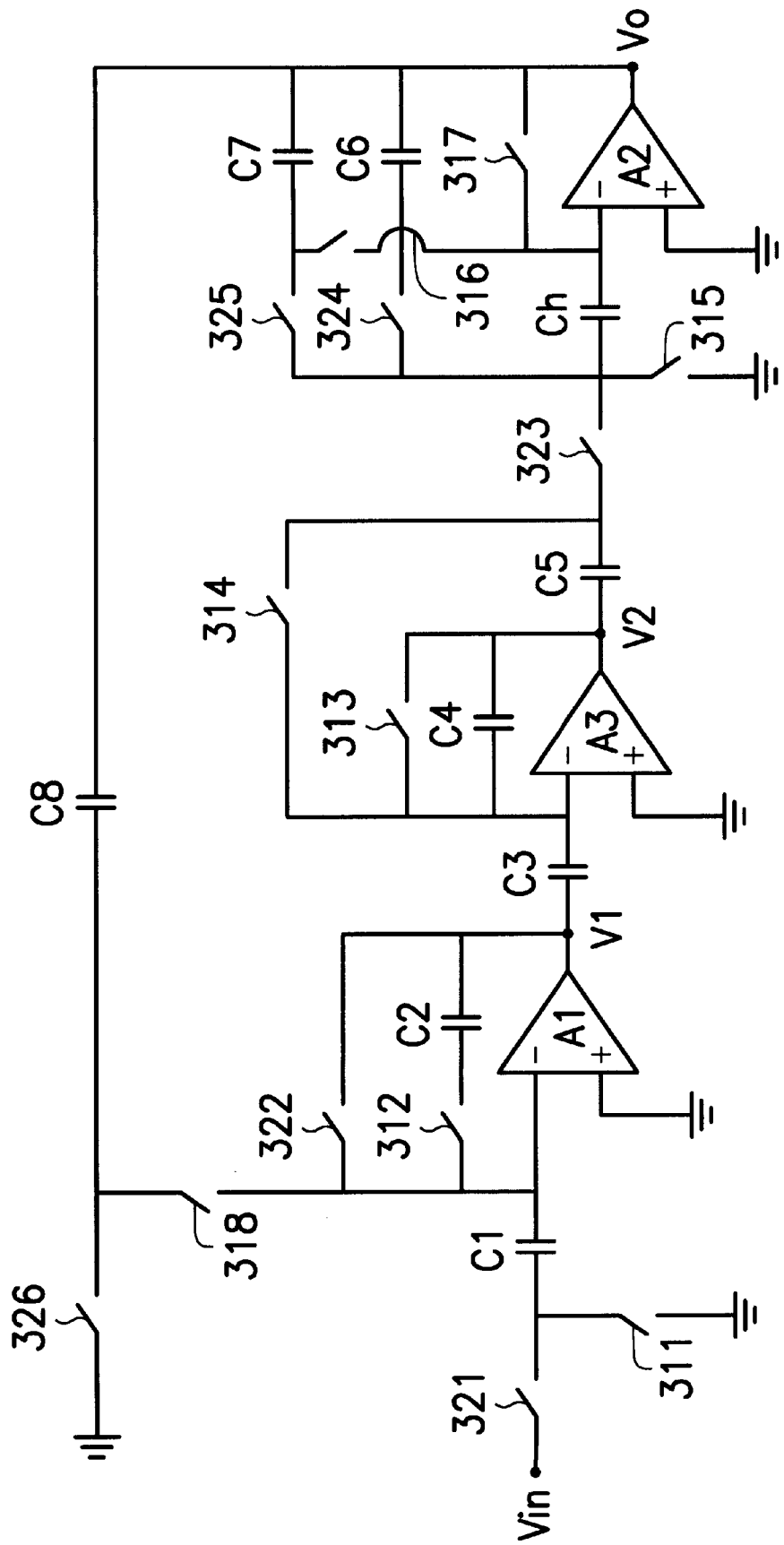
FIG. 5 is a circuit diagram illustrating a low-pass filter of another preferred embodiment of the present invention.

FIG. 5 is a circuit diagram illustrating a low-pass filter of another preferred embodiment of the present invention, which is constituted of portions of the non-inverting and inverting integrator circuits respectively shown in FIG. 2 and FIG. 4. As shown in FIG. 5., the filter circuit can also be operated under a low power voltage.

The filter circuit shown in FIG. 5 comprises three amplifiers A1, A2 and A3 coupled in series, capacitors C1–C8 and Ch, and MOS switches 311–318 and 321–326, wherein the capacitors C7 and C8 function equally as feedback resistors. Similar to the circuits shown in FIG. 2 and FIG. 3, the timing diagram shown in FIG. 3 is applied to operate the filter circuit in FIG. 5, wherein the switches 311–318 are in response to the timing waveform 01 and the switches 321–326 are in response to the timing waveform 02. Note that timing waveforms 01 and 02 having the same period show different logic levels at the same time, that is, switches 311–318 are on/off while switch 321–326 are off/on while the filter is operated.

When 01 rises to a high logic level in the filter in FIG. 5, the charge conservation gives:

$$V1(nT-T/2)-V1(nT-3T/2)=(C1/C2)Vin(nT-T)+\{C8/C2[(Voff1-Voff2)+Vo(nT-T))]\}=0 \quad (8)$$

If the offset voltages Voff1 and Voff2 are close and compensate each other, a z-transformed result of the equation (8) is:

$$(z^{-1/2}-z^{-3/2})V1(z)=(C1/C2)z^{-1}Vin(z)+(C8/C2)z^{-1}Vo(z) \quad (9)$$

When 02 rises to a high logic level in the filter in FIG. 5, the charge conservation gives:

$$V2(z)=(C3/C4)z^{-1/2}V1(z)+Voff3-(C3/C4)Voff1 \quad (10)$$

If the offset voltages Voff1 and Voff3 are close and the capacitance of the capacitors are equal, then the offset voltages Voff1 and Voff3 are compensated and the equation (10) becomes:

$$V2(z)=z^{-1/2}V1(z) \quad (11)$$

, wherein the relation between voltages V2 and Vo is:

$$Vo(z)(1-z^{-1})=-(C5/C6)V2(z)-(C7/C6)Vo(z) \quad (12)$$

By the equations (9), (11), and (12), the z-transform equation of the low-pass filter shown in FIG. 5 can be represented as:

$$Vo(z)/Vin(z)=-[(C5C1)/(C6C2)]z^{-1}/[1+C7/C6-(C5C8)Z^{-1}/(C6C2)+Z^{-2}] \quad (13)$$

In fact, according to the equation (13), the circuit shown in FIG. 5 can function as a low-pass filter while the proper ratios between the capacitance of the capacitors are determined.

Figure 1:
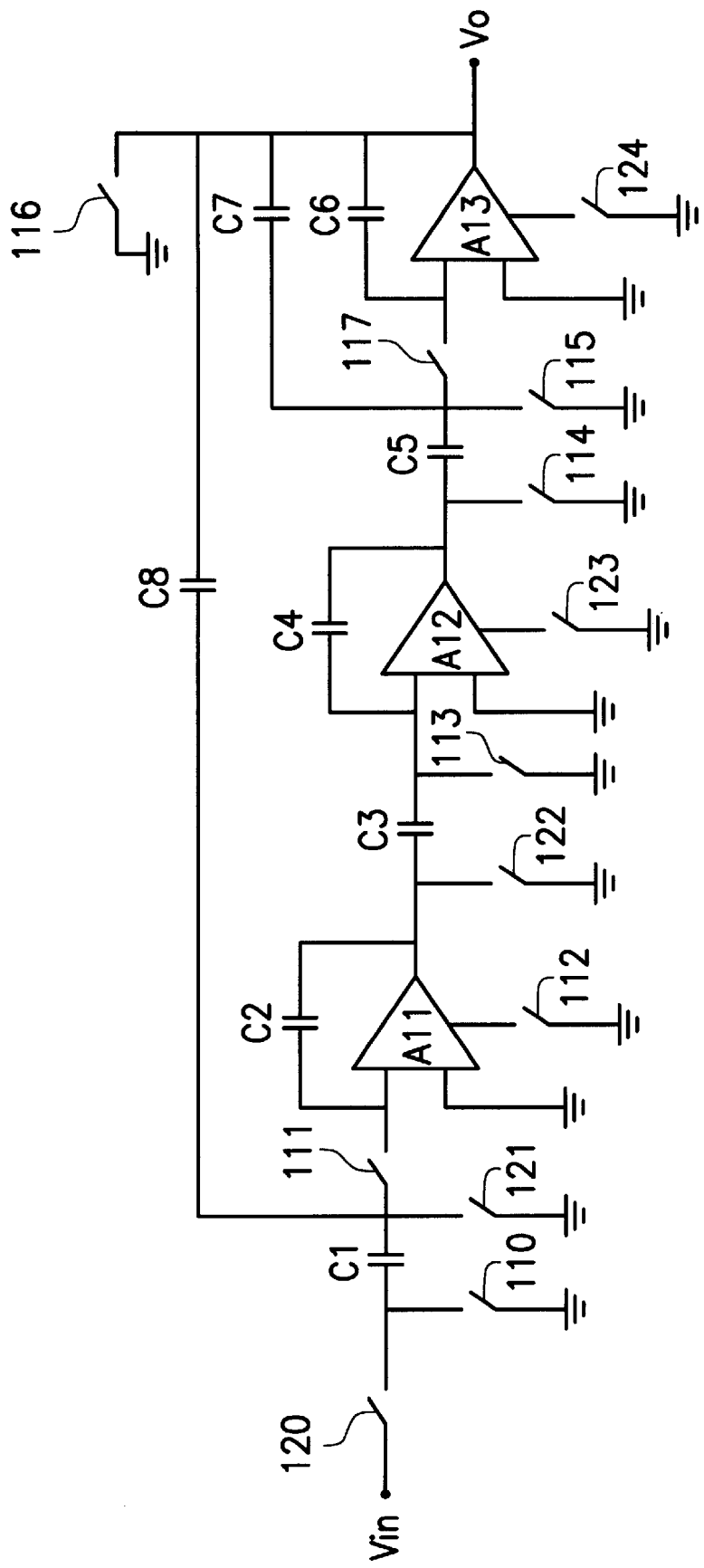
FIG. 1 is a circuit diagram illustrating a low-pass filter of the prior art.

FIG. 1 is a low-pass filter circuit of the prior art, which comprises three amplifiers coupled in series A11, A12, and A13, capacitors C1–C8, and switches 110–116 and 120–124, wherein there are two timing waveforms having the same period show different logic levels at the same time to operate the capacitors. To compare the low-pass filter in FIG. 5 disclosed in the present invention, both low-pass filter both have the same z-transform equation (13), but two drawbacks exist in the low-pass filter in FIG. 1 of the prior art. First, each amplifier needs to be switched. As shown in FIG. 1, the amplifiers A1, A2, and A3 are respectively switched by switches 112, 123, and 124. Moreover, the offset voltages from the amplifiers can not be compensated so as to reduce the operation precision of the low-pass filter.

Consequently, the disclosed non-inverting and inverting integrator and the low-pass filter of the present invention can not only be operated under a low power voltage, but also compensate the offset voltages created from the amplifiers, so as to increase the operation precision of the circuits.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. An integrator which operates under a low power voltage and provides compensation for offset voltages, the integrator comprising:

a first amplifier having a non-inverting input terminal coupled to a ground, an inverting input terminal, and an output terminal;

a fifth capacitor coupled to said inverting input terminal of said first amplifier;

a first capacitor, which has a first terminal coupled to said fifth capacitor and a second terminal receiving an input signal;

a first switch coupled between said second terminal of said first capacitor and said ground;

a second switch coupled between said ground and a terminal coupling said first capacitor and said fifth capacitor;

a third switch coupled to said terminal coupling, said first capacitor, and said fifth capacitor;

a second capacitor coupled between said third switch and said output terminal of said first amplifier;

a fourth switch coupled between said inverting input terminal and said output terminal of said first amplifier;

a third capacitor coupled to said output terminal of said first amplifier;

a second amplifier comprising a non-inverting input terminal coupled to said ground, an inverting input terminal coupled to said third capacitor (three capacitors), and an output terminal; and a fourth capacitor and a fifth switch coupled in parallel between said inverting input terminal and said output terminal of said second amplifier.

2. The integrator of claim 1 wherein a first timing waveform operates said first, second and fourth switches and a second timing waveform operates said third switch and fifth switch, said first and second timing waveforms having a same period and showing different logic levels at the same time.

3. A filter which operates under a low power voltage and provides compensation for offset voltages the filter, comprising:

- a first amplifier having a non-inverting input terminal coupled to a ground, an inverting input terminal, and an output terminal;
- a first capacitor coupled to said inverting input terminal of said first amplifier;
- a first switch coupled between said first capacitor and a signal input terminal;
- a second switch coupled between said ground and a terminal coupling said first capacitor and said first switch;
- a second capacitor coupled to said output terminal of said first amplifier;
- a third switch coupled between said inverting input terminal of said first amplifier and said second capacitor;
- a fourth switch coupled between said output terminal and said inverting input terminal of said first amplifier;
- a third capacitor coupled to said output terminal of said first amplifier;
- a second amplifier having a non-inverting input terminal coupled to a ground, an inverting input terminal coupled to said third capacitor, and an output terminal;
- a fourth capacitor and a fifth switch coupled in parallel between said inverting input terminal and said output terminal of said second amplifier;
- a fifth capacitor coupled to said output terminal of said second amplifier;
- a seventh switch coupled to said fifth capacitor;
- a sixth switch coupled between said inverting terminal of said second amplifier and a terminal coupling said fifth capacitor and said seventh switch;
- a ninth capacitor coupled to said seventh switch;
- an eighth switch coupled between said ground and a terminal coupling said seventh switch and said ninth capacitor;
- a third amplifier having a non-inverting input terminal coupled to a ground, an inverting input terminal coupled to said ninth capacitor, and an output terminal;
- a ninth switch coupled between said inverting input terminal and said output terminal of said third amplifier;
- a tenth switch and an eleventh switch coupled in parallel to a terminal coupling said ninth capacitor and said seventh switch;
- a six capacitor coupled between said tenth switch and said output terminal of said third amplifier;
- a seventh capacitor coupled between said eleventh switch and said output terminal of said third amplifier;
- a twelfth switch coupled between said inverting input terminal of said third amplifier and a terminal coupling said eleventh switch and said seventh capacitor; an eighth capacitor coupled to said output terminal of said third amplifier; a thirteenth switch coupled between said eighth capacitor and said ground; and a fourteenth switch coupled to said inverting input terminal of said first amplifier and a terminal coupling said eighth capacitor and said thirteenth switch.

4. The filter of claim 3, wherein a first timing waveform operates said second, third, fifth, sixth, eighth, ninth, eleventh, twelfth, and fourteenth switches and a second timing waveform operates said first, fourth, seventh, tenth, and thirteenth switch, said first and second timing waveforms having a same period and showing different logic levels at the same time.

* * * * *